(12) United States Patent
Biber et al.

(10) Patent No.: US 8,489,025 B2
(45) Date of Patent: Jul. 16, 2013

(54) METHOD FOR TRANSMITTING MAGNETIC RESONANCE SIGNALS WITH DOUBLE FREQUENCY CONVERSION

(75) Inventors: Stephan Biber, Erlangen/Frauenaurach (DE); Jan Bollenbeck, Eggolsheim (DE); Ralph Oppelt, Uttenreuth (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 273 days.

(21) Appl. No.: 13/069,272

(22) Filed: Mar. 22, 2011

(65) Prior Publication Data

US 2012/0071117 A1    Mar. 22, 2012

(30) Foreign Application Priority Data

Mar. 23, 2010 (DE) .......................... 10 2010 012 395

(51) Int. Cl.
*H04B 7/00*    (2006.01)

(52) U.S. Cl.
USPC ............. 455/41.2; 455/39; 455/41.3; 455/82; 324/307

(58) Field of Classification Search
USPC ........ 455/41.2, 41.3, 39–48, 59–90; 324/322, 324/309, 307, 312, 318
See application file for complete search history.

(56) References Cited

U.S. PATENT DOCUMENTS

| | | | |
|---|---|---|---|
| 5,160,891 A | 11/1992 | Keren | |
| 5,319,309 A * | 6/1994 | den Boef et al. | 324/309 |
| 6,268,729 B1 * | 7/2001 | Fuderer et al. | 324/309 |
| 6,297,637 B1 | 10/2001 | Feld et al. | |
| 6,541,972 B2 * | 4/2003 | Mulder et al. | 324/318 |
| 6,653,833 B2 * | 11/2003 | Baumgartl et al. | 324/307 |
| 6,768,302 B2 * | 7/2004 | Vester | 324/307 |
| 6,791,322 B2 * | 9/2004 | Vester | 324/309 |
| 7,132,826 B1 * | 11/2006 | Jung et al. | 324/307 |
| 7,750,630 B2 * | 7/2010 | Van Helvoort et al. | 324/307 |
| 8,055,196 B2 * | 11/2011 | Biber et al. | 455/41.2 |
| 2009/0179705 A1 | 7/2009 | Oppelt et al. | |
| 2009/0286478 A1 | 11/2009 | Biber et al. | |

FOREIGN PATENT DOCUMENTS

| | | |
|---|---|---|
| DE | 40 37 294 A1 | 7/1991 |
| EP | 0 554 584 A1 | 8/1993 |

OTHER PUBLICATIONS

German Office Action dated Dec. 16, 2010 for corresponding German Patent Application No. DE 10 2010 012 395.1-54 with English translation.

* cited by examiner

*Primary Examiner* — Pablo Tran
(74) *Attorney, Agent, or Firm* — Lempia Summerfield Katz LLC

(57) ABSTRACT

Front bandpass filters that are essentially transmissive only between a minimum frequency and a maximum frequency filter the magnetic resonance signals. Front frequency mixers mix output signals of each of the bandpass filters with a front LO frequency that is standard for all the magnetic resonance signals. Rear bandpass filters that are essentially transmissive only around a front intermediate frequency filter the output signals of the front frequency mixers. Rear frequency mixers mix output signals of each of the rear bandpass filters with a respective constant rear LO frequency. Frequency filters that are transmissive for frequencies in the range of the difference of the rear LO frequency that is supplied to the rear frequency mixer arranged upstream thereof and the front intermediate frequency filter the output signals of the rear frequency mixers. Output signals of the frequency filters are combined into a common signal, which is transmitted onward.

20 Claims, 3 Drawing Sheets

METHOD FOR TRANSMITTING MAGNETIC RESONANCE SIGNALS WITH DOUBLE FREQUENCY CONVERSION

This application claims the benefit of DE 10 2010 012 395.1, filed Mar. 23, 2010.

BACKGROUND

The present embodiments relate to a transmission method and a transmission device for at least two magnetic resonance signals.

In magnetic resonance tomography, images having a high signal-to-noise ratio may be detected by local coils and transmitted (e.g., over a wired link) to an evaluation device for further processing. A large number of local coils may be present. If a separate cable is laid for each local coil, this represents an extremely high cabling requirement.

According to the approach known from US 2009/286478 A1, two magnetic resonance signals are transmitted per cable. In principle, this procedure may also be extended to more than two magnetic resonance signals. With this method, the conversion is performed by a corresponding transmission device that is arranged in proximity to the local coils.

The known transmission method already works well. However, the bandpass filters are tuned to the Larmor frequency. A separate transmission device with correspondingly configured bandpass filters is therefore used for each Larmor frequency.

SUMMARY AND DESCRIPTION

The present embodiments may obviate one or more of the drawbacks or limitations in the related art. For example, a transmission device that transmits a plurality of signals, where the Larmor frequency varies over relatively large frequency ranges, is provided.

According to the present embodiments, a method for transmitting at least two magnetic resonance signals that are each detected by a local coil is provided. The at least two magnetic resonance signals have frequencies around a Larmor frequency. The at least two magnetic resonance signals are each filtered in a respective front bandpass filter, and the front bandpass filters are essentially transmissive only between a minimum frequency and a maximum frequency. Output signals of each of the front bandpass filters are mixed with a front LO frequency that is standard for all the magnetic resonance signals in a respective front frequency mixer. The front LO frequency is set such that the difference between the front LO frequency and the Larmor frequency is roughly equal to a predetermined front intermediate frequency that is above the maximum frequency. Output signals of the front frequency mixers are each filtered in a respective rear bandpass filter, and the rear bandpass filters are essentially transmissive only around the intermediate frequency. Output signals of the rear bandpass filters are each mixed with a respective rear LO frequency in a respective rear frequency mixer. The rear LO frequencies are constant, and amounts of the differences between the rear LO frequencies and the front intermediate frequency are different from one another in pairs. Output signals of the rear frequency mixers are each filtered in a respective frequency filter. The frequency filters are each configured such that the frequency filter is non-transmissive for frequencies in the range of the difference between the rear LO frequency that is supplied to the rear frequency mixer arranged upstream of the frequency filter and the front intermediate frequency, and are non-transmissive for frequencies in the range of the differences between all the other rear LO frequencies and the front intermediate frequency. The output signals of the frequency filters are combined into a common signal, and the common signal is transmitted onward.

At least one of the rear LO frequencies is less than the front intermediate frequency, and at least one other of the rear LO frequencies is greater than the front intermediate frequency. This approach may have operational and technical advantages.

The amount of the difference between one of the rear LO frequencies and the front intermediate frequency may be greater than 11 MHz. In one embodiment, the amount of the difference between the one rear LO frequency and the front intermediate frequency is between 11 MHz and 12.5 MHz. The amount of the difference between another of the rear LO frequencies and the front intermediate frequency may be less than 9 MHz. In one embodiment, the amount of the difference between the other rear LO frequency and the front intermediate frequency is between 7.5 MHz and 9 MHz. Based on this approach, the same evaluation device as is used in US 2009/286478 A1 may be used.

The two above-mentioned embodiments may be combined with one another. In one embodiment, the one rear LO frequency is smaller than the front intermediate frequency by less than 9 MHz and the other rear LO frequency is greater than the front intermediate frequency by at least 11 MHz.

The rear bandpass filters may be configured as surface acoustic wave filters. Bandpass filters of this type are easy to implement with the frequency characteristics and are commercially available on the market. Therefore, an "off the shelf" product can be used.

In one embodiment, the output signals of the rear bandpass filters are amplified in a respective front intermediate frequency amplifier before being supplied to the rear frequency mixers.

In another embodiment, the output signals of the rear frequency mixers are also amplified in a respective rear intermediate frequency amplifier before being supplied to the frequency filters. The amplification in the rear intermediate frequency amplifiers may be performed at a frequency response of +/−6 dB per octave.

If the output signals of the rear frequency mixers are amplified with the frequency response of 6 dB per octave, the evaluation circuit, to which the common signal is transmitted, may have complementary amplifiers. In terms of approach, this is known from US 2009/179705 A1.

The front intermediate frequency may be at least 5% greater than the maximum frequency. In one embodiment, the front intermediate frequency may be at least 10% greater. The design of the transmission device may be simplified as a result of this embodiment.

The front bandpass filters may be configured as wideband. For example, the minimum frequency may be approximately 39 MHz and the maximum frequency may be approximately 300 MHz.

In one embodiment, a transmission device of the type cited in the background has a frequency input for supplying a front LO frequency and rear LO frequencies and is configured such that the transmission device determines the common signal on the basis of a transmission method according to the present embodiments.

DETAILED DESCRIPTION OF THE DRAWINGS

Figure 1:
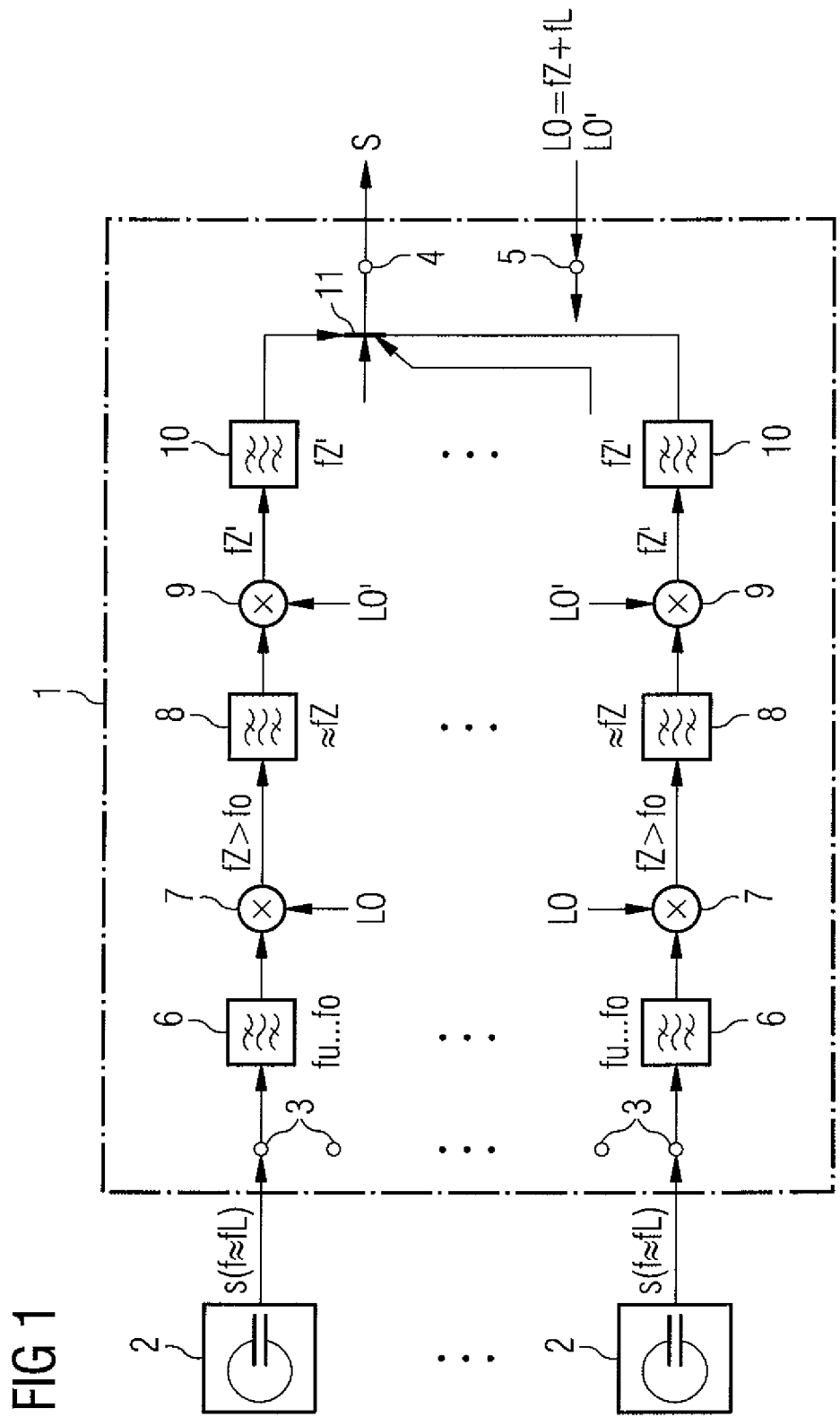
FIG. 1 shows a transmission arrangement.

According to FIG. 1, a plurality of magnetic resonance signals s, which are each detected by a local coil 2, are combined into a common signal S using a transmission device 1. For that purpose, the transmission device 1 includes a number of signal inputs 3. One of the magnetic resonance signals s is supplied to the transmission device 1 via each of the signal inputs 3. The signal inputs 3 may be high-frequency inputs, for example. The signal inputs 3 may be configured as terminals for coaxial cables, for example.

The transmission device 1 includes a signal output 4. The transmission device 1 outputs the common signal S via the signal output 4. The common signal S may be of a considerably lower frequency than the magnetic resonance signals s. The signal output 4 may or may not be a high-frequency output. Alternatively, the signal output 4 may be configured as a simple plug-in connector, for example.

The transmission device 1 also includes a frequency input 5. A front local oscillator (LO) frequency LO and rear LO frequencies LO' are supplied to the transmission device 1 via the frequency input 5.

The magnetic resonance signals s have frequencies f that are in a relatively narrow frequency band (e.g., under 1 MHz) around a Larmor frequency fL. However, the Larmor frequency fL may vary widely (e.g., dependent on the strength of the constant magnetic field of the magnetic resonance system and dependent on the nucleus, for which nuclear spin is to be detected. At a constant magnetic field of 7 T, the Larmor frequency fL may be, for example, between approximately 39 MHz for oxygen-17 and just under 300 MHz for protons.

For each magnetic resonance signal s, the transmission device 1 includes a front bandpass filter 6, in which the respective magnetic resonance signal s is filtered. In one embodiment, the front bandpass filters 6 are identical. The front bandpass filters 6 are essentially transmissive between a minimum frequency fu and a maximum frequency fo. The front bandpass filters 6 may only be essentially transmissive between the minimum frequency fu and the maximum frequency fo. The term "essentially" in relation to the transmittance curve of the front bandpass filters 6 is used because the bandpass characteristics run continuously (i.e., the bandpass characteristics do not abruptly decrease from a high value to a low value or increase from a low value to a high value). The transition extends consistently over a specific frequency band.

The minimum frequency fu and the maximum frequency fo may be determined as required. If, for example, according to the arrangement illustrated in FIG. 2, the minimum frequency fu and the maximum frequency fo are approximately 39 MHz and 300 MHz, respectively, the front bandpass filters 6 are transmissive for all Larmor frequencies fL that may occur in a 7-Tesla system. In a 9-Tesla system, the corresponding frequencies are at approximately 50 MHz and approximately 382 MHz, for example. In an 11-Tesla system the corresponding frequencies are at approximately 61 MHz and at approximately 466 MHz, for example.

For each magnetic resonance signal s supplied to the transmission device 1, the transmission device 1 also has a front frequency mixer 7. In one embodiment, the front frequency mixers 7 are identical. Each of the front frequency mixers 7 is supplied with an output signal of the front bandpass filter 6 disposed upstream of the front frequency mixer 7. The front frequency mixers 7 are supplied with the front LO frequency LO. The front LO frequency LO is standard for all the front frequency mixers 7.

The front frequency mixers 7 mix the output signals of the front bandpass filters 6 with the front LO frequency LO, such that the sum frequencies and the difference frequencies are present at the outputs of the front frequency mixers 7.

The front LO frequency LO is set as a function of the respective Larmor frequency fL. The front LO frequency is set such that the difference frequency of the respective Larmor frequency fL and the front LO frequency LO is roughly equal to a front intermediate frequency fZ that is standard for the magnetic resonance signals s. The deviation of the difference frequency from the predetermined front intermediate frequency ZF may be 1 MHz at a maximum. In one embodiment, the deviation of the difference frequency from the predetermined front intermediate frequency ZF is 750 kHz at a maximum.

The front intermediate frequency fZ has the same value, irrespective of the Larmor frequency fL. The front intermediate frequency fZ is chosen such that the front intermediate frequency fZ is greater than the maximum frequency fo of the front bandpass filters 6. Frequency mixing with a high-lying (front) intermediate frequency fZ is therefore performed in the front frequency mixers 7.

The front intermediate frequency fZ may be at least 5% greater than the maximum frequency fo. In one embodiment, the front intermediate frequency fZ is at least 10% greater than the maximum frequency fo. If, according to the arrangement illustrated in FIG. 2, the maximum frequency fo is, for example, 300 MHz, then the front intermediate frequency a may be, for example, approximately 340 MHz.

For each magnetic resonance signal s supplied to the transmission device 1, the transmission device 1 also has a rear bandpass filter 8. In one embodiment, the rear bandpass filters 8 are the same. The output signals of the front frequency mixers 7 are filtered in the rear bandpass filters 8. The rear bandpass filters 8 are essentially transmissive around the front intermediate frequency fZ. In one embodiment, the rear bandpass filters 8 are essentially transmissive only around the front intermediate frequency fZ. The frequency range, around which the rear bandpass filters 8 are transmissive, may be relatively small. For example, the passband range may have a maximum width of 20 MHz. In one embodiment, the passband range has a maximum width of 10 MHz or 5 MHz.

Figure 2:
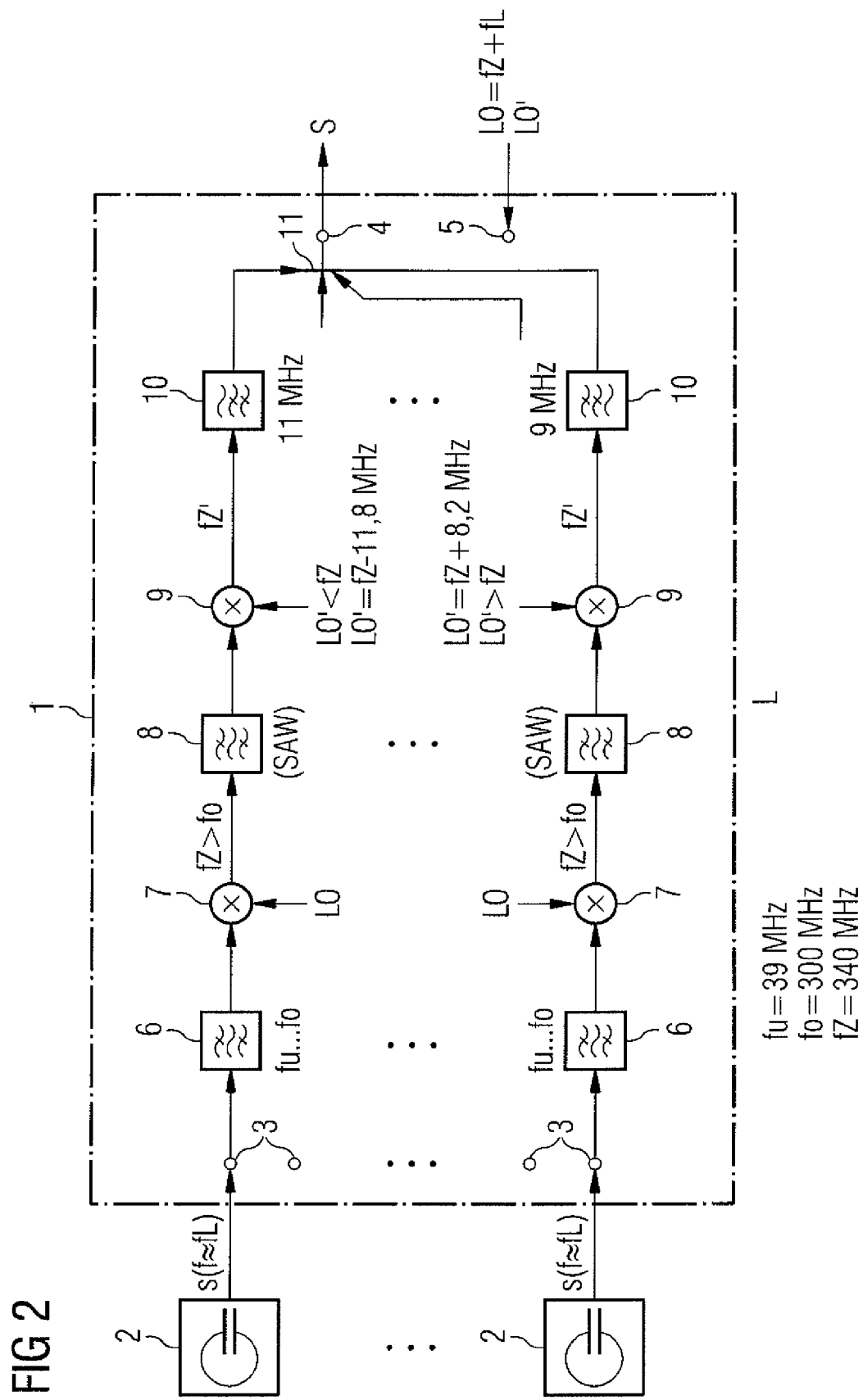
FIG. 2 shows an embodiment of the transmission arrangement of FIG. 1.

In order to enable such small passband ranges to be realized, the rear bandpass filters 8 may be configured as, for example, surface acoustic wave (SAW) filters in accordance with the arrangement illustrated in FIG. 2.

For each magnetic resonance signal s supplied to the transmission device 1, the transmission device 1 also includes a rear frequency mixer 9. In one embodiment, the rear frequency mixers 9 are the same. One of the output signals of the rear bandpass filters 8 is supplied to each of the rear frequency mixers 9. A respective rear LO frequency LO' is supplied to each rear frequency mixer 9.

In contrast to the front LO frequency LO, the rear LO frequencies LO' are constant. Also in contrast to the front LO frequency LO, which is predefined as standard for all the front frequency mixers 7, the rear LO frequencies LO' are different from one another in pairs.

The rear frequency mixers 9 mix the output signals of the rear bandpass filters 8 with the respective rear LO frequencies LO' and in this way, generate the respective sum and difference frequencies. The rear LO frequencies LO' are determined such that amounts of the differences between the rear LO frequencies LO' and the front intermediate frequency fZ (referred to in the following as rear intermediate frequencies fZ') are different from one another in pairs.

All the rear LO frequencies LO' may be less than the front intermediate frequency fZ. Alternatively, all the rear LO frequencies LO' may be greater than the front intermediate frequency fZ. In one embodiment, according to the arrangement illustrated in FIG. 2, one of the rear LO frequencies LO' is less than the front intermediate frequency fZ, while another of the rear LO frequencies LO' is greater than the front intermediate frequency fZ.

The rear intermediate frequencies fZ' may also be determined as required. The distances of the rear intermediate frequencies fZ' from one another are greater than the bandwidth of the magnetic resonance signals s. The difference between any two rear intermediate frequencies fZ' may be at least 1 to 2 MHz. According to the arrangement illustrated in FIG. 2, one of the rear intermediate frequencies fZ' may be greater than 11 MHz, and another of the rear intermediate frequencies fZ' may be less than 9 MHz. For example, as shown in FIG. 2, the one rear intermediate frequency fZ' may be between 11 MHz and 12.5 MHz, and the other rear intermediate frequency fZ' may be between 7.5 MHz and 9 MHz.

For each magnetic resonance signal s supplied to the transmission device 1, the transmission device 1 also has a frequency filter 10, in which the output signal of the corresponding rear frequency mixer 9 arranged upstream thereof is filtered. The frequency filters 10 are configured such that each of the frequency filters are transmissive in the range of the rear intermediate frequency fZ' of the rear frequency mixer 9 disposed upstream thereof and non-transmissive in the range of all the other rear intermediate frequencies fZ'. According to the arrangement illustrated in FIG. 1, the frequency filters 10 may be configured as bandpass filters. The frequency filter 10 having the highest rear intermediate frequency fZ' may alternatively be configured as a highpass filter. Analogously, the frequency filter 10 having the lowest rear intermediate frequency fZ' may be configured as a lowpass filter. This representation is chosen in FIG. 2.

According to FIG. 1, the output signals of the frequency filters 10 are combined into the common signal S in a node 11 and supplied to the signal output 4. Starting from the signal output 4, the common signal S is transmitted onward (e.g., via a suitable line).

Figure 3:
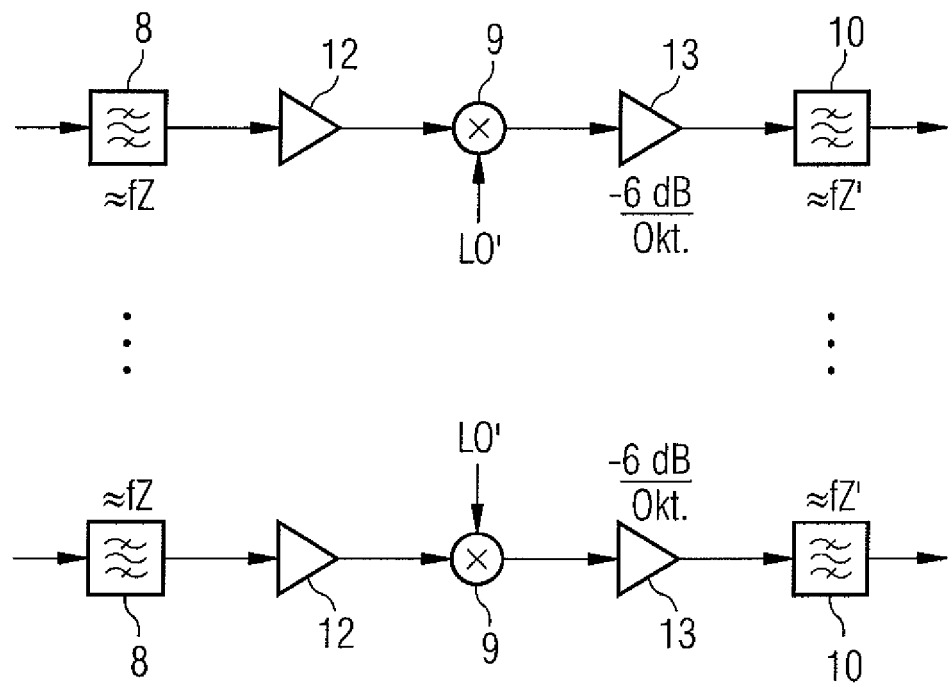
FIG. 3 shows other embodiments of the transmission arrangement of FIG. 1.

The transmission device 1 according to the present embodiments as explained above in conjunction with FIG. 1 (complemented where applicable by the embodiments according to FIG. 2) may be configured according to FIG. 3. FIG. 3 shows several embodiments, which may be realized alternatively or cumulatively.

According to FIG. 3, for example, front intermediate frequency amplifiers 12 may be arranged between the rear bandpass filters 8 and the rear frequency mixers 9. The output signals of the rear bandpass filters 8 are amplified in the front intermediate frequency amplifiers 12 before being supplied to the rear frequency mixers 9. The front intermediate frequency amplifiers 12 may be configured as required for this purpose.

Alternatively or in addition, according to the arrangement illustrated in FIG. 3, rear intermediate frequency amplifiers 13 may be arranged between the rear frequency mixers 9 and the frequency filters 10. The output signals of the rear frequency mixers 9 are amplified in the rear intermediate frequency amplifiers 13 before being supplied to the frequency filters 10.

The rear intermediate frequency amplifiers 13 may also be configured as required. In one embodiment, the rear intermediate frequency amplifiers 13 are configured such that the rear intermediate frequency amplifiers 13 amplify the output signals of the rear frequency mixers 9 with a frequency response of +/−6 dB per octave. Corresponding amplifier circuits are known. In one embodiment, the amplifier circuits are configured as described in US 2009/179705 A1.

Transmission devices 1 with two magnetic resonance signals s and the processing thereof, have been explained above in conjunction with FIGS. 1 and 2. However, the transmission device 1 according to the present embodiment is also readily suitable for combining more than two magnetic resonance signals s. The factor that is taken into account is that all the rear intermediate frequencies fZ' are separated from one another by a sufficient distance.

The present embodiments have many advantages. The present embodiments may be easy to implement and may be realized at low cost. The present embodiments may also be reliable in operation. Given suitable configuration (e.g., of the front bandpass filters 6), the transmission device 1 may be used for all the Larmor frequencies fL that may occur at a given constant magnetic field of for example, 7 T.

The above description serves solely to explain the present embodiments. In contrast, the scope of protection of the present embodiments shall be determined solely by the attached claims.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for transmitting at least two magnetic resonance signals that are each detected by a respective local coil, the method comprising:

filtering each of the at least two magnetic resonance signals in a front bandpass filter, the at least two magnetic resonance signals having frequencies substantially equal to a Larmor frequency, the front bandpass filters being essentially transmissive only between a minimum frequency and a maximum frequency;

mixing, in a respective front frequency mixer, output signals of the front bandpass filters with a respective front local oscillator (LO) frequency that is standard for the at least two magnetic resonance signals, the front LO frequency being set such that a difference between the front LO frequency and the Larmor frequency is approximately equal to a predetermined front intermediate frequency that is greater than the maximum frequency;

filtering output signals of the front frequency mixers in a respective rear bandpass filter, the rear bandpass filters being essentially transmissive only around the predetermined front intermediate frequency;

mixing, in a respective rear frequency mixer, the output signals of the rear bandpass filters with a respective rear LO frequency, the rear LO frequencies being constant and the amounts of differences between the rear LO frequencies and the predetermined front intermediate frequency being different from one another in pairs;

filtering, in a respective frequency filter, the output signals of the rear frequency mixers, the frequency filters being configured such that the frequency filters are transmissive for frequencies in the range of a difference between the rear LO frequency that is supplied to the rear frequency mixer arranged upstream and the front intermediate frequency, and being configured such that the frequency filters are non-transmissive for frequencies in the range of the differences between all other rear LO frequencies and the predetermined front intermediate frequency; and combining the output signals of the frequency filters into a common signal and transmitting the common signal.

2. The method as claimed in claim 1, wherein at least one of the rear LO frequencies is less than the front intermediate frequency and at least one other of the rear LO frequencies is greater than the front intermediate frequency.

3. The method as claimed in claim 1, wherein the rear bandpass filters comprise surface acoustic wave filters.

4. The method as claimed in claim 1, wherein the amount of the difference between one of the rear LO frequencies and the front intermediate frequency is greater than 11 MHz and the amount of the difference between another of the rear LO frequencies and the front intermediate frequency is less than 9 MHz.

5. The method as claimed in claim 4, wherein the amount of the difference between the one of the rear LO frequencies and the front intermediate frequency is between 11 MHz and 12.5 MHz.

6. The method as claimed in claim 4, wherein the amount of the difference between the other of the read LO frequencies and the front intermediate frequency is between 7.5 MHz and 9 MHz.

7. The method as claimed in claim 4, wherein the output signals of the rear bandpass filters are amplified in a respective front intermediate frequency amplifier before being supplied to the rear frequency mixers.

8. The method as claimed in claim 1, wherein the rear bandpass filters comprise surface acoustic wave filters.

9. The method as claimed in claim 1, wherein the output signals of the rear bandpass filters are amplified in a respective front intermediate frequency amplifier before being supplied to the rear frequency mixers.

10. The method as claimed in claim 1, wherein the output signals of the rear frequency mixers are amplified in a respective rear intermediate frequency amplifier before being supplied to the frequency filters.

11. The method as claimed in claim 8, wherein the output signals of the rear bandpass filters are amplified in a respective front intermediate frequency amplifier before being supplied to the rear frequency mixers.

12. The method as claimed in claim 1, wherein the output signals of the rear frequency mixers are amplified in a respective rear intermediate frequency amplifier before being supplied to the frequency filters.

13. The method as claimed in claim 12, wherein the output signals of the rear frequency mixers are amplified with a frequency response of 6 dB per octave in the rear intermediate frequency amplifiers.

14. The method as claimed in claim 1, wherein the front intermediate frequency is at least 5% greater than the maximum frequency.

15. The method as claimed in claim 14, wherein the front intermediate frequency is at least 10% greater than the maximum frequency.

16. The method as claimed in claim 1, wherein the minimum frequency is approximately 39 MHz, and the maximum frequency is approximately 300 MHz.

17. The method as claimed in claim 14, wherein the minimum frequency is approximately 39 MHz, and the maximum frequency is approximately 300 MHz.

18. A transmission device for at least two magnetic resonance signals, each of the at least two magnetic resonance signals being detected by a respective local coil, the transmission device comprising:

a plurality of signal inputs, each signal input of the plurality being for supplying one of the at least two magnetic resonance signals;

a signal output for outputting a common signal;

a frequency input for supplying a front LO frequency and rear LO frequencies;

front bandpass filters each configured to filter one of the at least two magnetic resonance signals, the at least two magnetic resonance signals having frequencies substantially equal to a Larmor frequency, the front bandpass filters being essentially transmissive only between a minimum frequency and a maximum frequency;

front frequency mixers each configured to mix output signals of one of the front bandpass filters with a respective front local oscillator (LO) frequency that is standard for the at least two magnetic resonance signals, the front LO frequency being set such that a difference between the front LO frequency and the Larmor frequency is approximately equal to a predetermined front intermediate frequency that is greater than the maximum frequency;

rear bandpass filters each configured to filter output signals of one of the front frequency mixers, the rear bandpass filters being essentially transmissive only around the predetermined front intermediate frequency;

rear frequency mixers each configured to mix output signals of one of the rear bandpass filters with a respective rear LO frequency, the rear LO frequencies being constant and the amounts of differences between the rear LO frequencies and the predetermined front intermediate frequency being different from one another in pairs; and frequency filters configured to filter the output signals of the rear frequency mixers, the frequency filters being configured such that the frequency filters are transmissive for frequencies in the range of a difference between the rear LO frequency that is supplied to the rear frequency mixer arranged upstream and the predetermined front intermediate frequency, and being configured such that the frequency filters are non-transmissive for frequencies in the range of the differences between all other rear LO frequencies and the predetermined front intermediate frequency, wherein the transmission device is configured to combine the output signals of the frequency filters into a common signal and transmit the common signal.

19. A method for transmitting at least two magnetic resonance signals that are each detected by a local coil, the method comprising:

filtering each of the at least two magnetic resonance signals in a front bandpass filter, the front bandpass filters being essentially transmissive only between a minimum frequency and a maximum frequency;

mixing, in a respective front frequency mixer, output signals of the front bandpass filters with a respective front local oscillator (LO) frequency that is standard for the at least two magnetic resonance signals, the front LO frequency being set such that a difference between the front LO frequency and the Larmor frequency is approximately equal to a predetermined front intermediate frequency that is greater than the maximum frequency;

filtering output signals of the front frequency mixers in a respective rear bandpass filter, the rear bandpass filters being essentially transmissive only around the predetermined front intermediate frequency mixing, in a respective rear frequency mixer, the output signals of the rear bandpass filters with a respective rear LO frequency, the rear LO frequencies being constant and the amounts of differences between the rear LO frequencies and the predetermined front intermediate frequency being different from one another in pairs;

filtering, in a respective frequency filter, the output signals of the rear frequency mixers, the frequency filters being configured such that the frequency filters are transmissive for frequencies in the range of a difference between the rear LO frequency that is supplied to the rear frequency mixer arranged upstream and the front intermediate frequency, and being configured such that the frequency filters are non-transmissive for frequencies in the range of the differences between all other rear LO frequencies and the predetermined front intermediate frequency; and combining the output signals of the frequency filters into a common signal and transmitting the common signal.

20. The method as claimed in claim 19, wherein the at least two magnetic resonance signals have frequencies substantially equal to a Larmor frequency.

\* \* \* \* \*